US006911656B2

United States Patent
Liu et al.

(10) Patent No.: US 6,911,656 B2
(45) Date of Patent: Jun. 28, 2005

(54) ROTATIONAL STAGE FOR HIGH SPEED, LARGE AREA SCANNING IN FOCUSED BEAM SYSTEMS

(75) Inventors: Yong Yu Liu, Singapore (SG); Daniel S. H. Chan, Singapore (SG); Jacob C. H. Phang, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/884,698

(22) Filed: Jul. 1, 2004

(65) Prior Publication Data

US 2004/0251425 A1 Dec. 16, 2004

Related U.S. Application Data

(63) Continuation of application No. 10/245,865, filed on Sep. 16, 2002, now Pat. No. 6,777,688.

(51) Int. Cl.[7] .......................... H01J 37/20; H01J 37/00
(52) U.S. Cl. ................. 250/442.11; 250/306; 250/307; 250/309; 250/310; 250/311; 250/440.11; 250/441.11; 250/442.11; 250/492.1; 250/492.2; 250/492.3; 250/492.21; 250/492.22
(58) Field of Search .................... 250/306–311, 440.11, 250/441.11, 442.11, 492.1–492.3, 492.21, 492.22; 356/399

(56) References Cited

U.S. PATENT DOCUMENTS

| | | | | |
|---|---|---|---|---|
| 3,919,558 | A | 11/1975 | Brouillette et al. | 250/443.1 |
| 4,376,891 | A | * 3/1983 | Rauscher et al. | 250/307 |
| 5,888,682 | A | 3/1999 | Nakasuji | 430/22 |
| 5,986,795 | A | 11/1999 | Nakasuji | 356/399 |
| 6,444,991 | B1 | * 9/2002 | Yamada et al. | 250/442.11 |
| 6,683,316 | B2 | * 1/2004 | Schamber et al. | 250/492.1 |
| 2002/0175295 | A1 | 11/2002 | Gordon et al. | 250/491.1 |
| 2002/0186632 | A1 | * 12/2002 | Kumasaka et al. | 369/47.49 |

* cited by examiner

*Primary Examiner*—John R Lee
*Assistant Examiner*—Bernard E. Souw
(74) *Attorney, Agent, or Firm*—David Jaffer; Pillsbury Winthrop LLP

(57) ABSTRACT

A mechanical scanning stage for high speed image acquisition in a focused beam system. The mechanical scanning stage preferably is a combination of four stages. A first stage provides linear motion. A second stage, above the first stage, provides rotational positioning. A third stage above the rotational stage is moveable in a first linear direction, and the fourth stage above the third stage is positionable in a second linear direction orthogonal to the first direction. The four stages are responsive to input from a controller programmed with a polar coordinate pixel addressing method, for positioning a specimen mounted on the mechanical stage to allow an applied static focus beam to irradiate selected areas of interest, thereby imaged by collecting signals from the specimen using a polar coordinate pixel addressing method.

11 Claims, 2 Drawing Sheets

ROTATIONAL STAGE FOR HIGH SPEED, LARGE AREA SCANNING IN FOCUSED BEAM SYSTEMS

This application is a continuation of U.S. Pat. Ser. No. 10/245,865 filed on Sep. 16, 2002 now U.S. Pat. No. 6,777,688.

BACKGROUND OF THE INVENTION

1. Field of the Invention

The present invention relates generally to moveable stages for use in focused beam systems; and more particularly to a high speed rotational stage in conjunction with a linear stage to form a high speed scanning system without scanning the beam, allowing a large area specimen to be imaged with a substantially higher speed using an optimally focused beam.

2. Description of the Prior Art

In the context of scanning microscopy, the most common image formation systems in the prior art make use of Cartesian raster scanning to form an image. In a typical imaging system, a source of energy such as an electron beam, ion beam or photon beam is used to irradiate a specimen. The interaction between the source beam and the specimen produces a signal that can be detected which corresponds to the signal intensity at the interaction point. There are two Cartesian raster scanning mechanisms commonly used to form an image: (1) a beam scanning system wherein the source beam is Cartesian raster scanned over the area of interest of a static specimen; (2) a stage scanning system wherein the specimen is mounted on a mechanical Cartesian scanning stage, and the stage is scanned with respect to the static source beam to cover the area of interest.

In a beam scanning system, the source beam is typically scanned from left to right in a raster manner, pixel by pixel, before 'flying back' to the beginning of the next line. This process repeats from the top to the bottom for a complete image acquisition before returning to the top of the scan again. In a stage scanning system, the mechanical scanning stages scan from left to right in a raster manner using stepper motors, servo motors or voice coils. These two methods impose significant problems and limitations. Firstly, both methods need a fly-back at the end of each line scan, which slows down the image acquisition. For the stage scanning system, the relatively large mass of the mechanical stage needs significant settling time, which further slows down the rate of image acquisition. In addition to this, the beam scanning system suffers from aberrations when the beam is deflected from the optical axis while scanning a relatively large area. This is a serious drawback of the beam scanning system when scanning a large area.

In conclusion, a mechanical scanning stage with high speed capability for large area specimen scanning would have advantages in many applications.

SUMMARY OF INVENTION

It is, therefore, an object of the present invention to provide a mechanical scanning stage for high speed image acquisition in a focused beam system.

It is another object of the present invention to provide a mechanical scanning stage that can achieve high speed image acquisition of a large area specimen.

Briefly, a preferred embodiment of the present invention includes a mechanical scanning stage for high speed image acquisition in a focused beam system. The mechanical scanning stage preferably is a combination of four stages. A first stage provides linear motion. A second stage, above the first stage, provides rotational positioning. A third stage above the rotational stage is moveable in a first linear direction, and the fourth stage above the third stage is positionable in a second linear direction orthogonal to the first direction. The four stages are responsive to input from a controller programmed with a polar coordinate pixel addressing method, for positioning a specimen mounted on the mechanical stage to allow an applied static focus beam to irradiate selected areas of interest, thereby imaged by collecting signals from the specimen using a polar coordinate pixel addressing method.

IN THE DRAWING

DESCRIPTION OF PREFERRED EMBODIMENT

Figure 1:
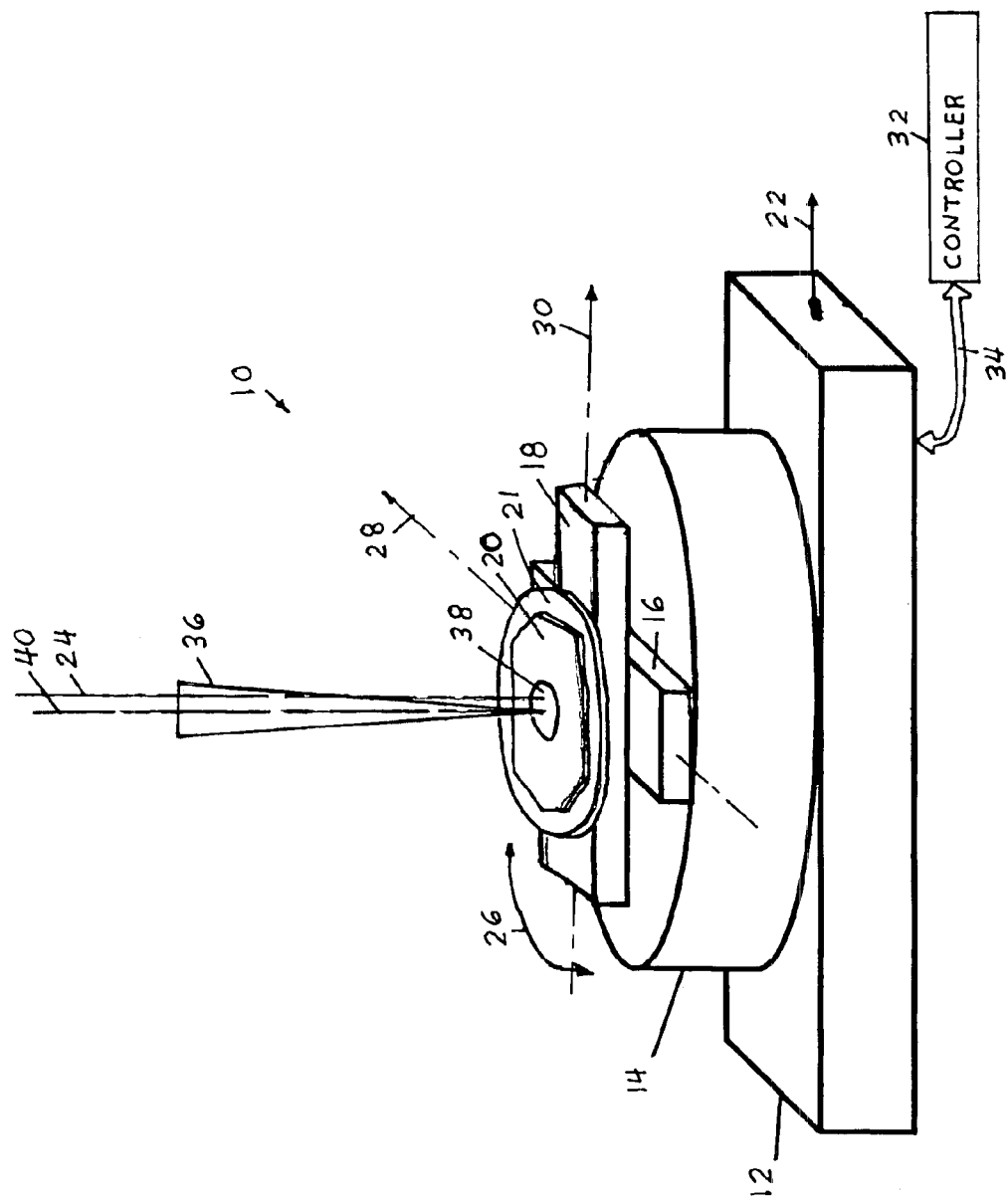
FIG. 1 is a three dimensional view illustrating a preferred embodiment of the present invention.

Referring now to FIG. 1 of the drawing, a preferred embodiment of the present invention includes a mechanical scanning stage 10 constructed as a combination of four stages 12–18 for positioning a specimen 20. The specimen 20 is placed on specimen mounting apparatus, such as a plate 21 attached to the uppermost stage, which as illustrated in FIG. 1 is stage 18. The first stage 12 provides linear motion along a direction/axis 22. The second stage 14 is configured to rotate the specimen 20 in its plane, around an axis 24 orthogonal to the specimen. This is indicated by rotational arrow 26. The third stage 16, also designated as a Y position stage, is for moving the specimen linearly in a first (Y) direction indicated by arrow 28, and the fourth stage 18 (X positioning stage) provides linear motion in a second (X) direction 30, orthogonal to the first (Y) direction 28. All of the four stages 12-18 are configured to be responsive to direction from a controller 32. Communication for direction of all four stages is symbolically illustrated by arrow/bus 34. The actual connection/communication method can be either wired or wireless, which will be apparent to those skilled in the art.

The arrangement of the four stages in FIG. 1 is given to illustrate a particular embodiment of the present invention. Various alternate embodiments will be apparent to those skilled in the art upon reading the present disclosure, and these are to be included in the present invention. For example, stages 12 and 14 can be reversed in their vertical placement in the stack of stages. As will be discussed in the following, a further alternate embodiment includes the third and fourth stages eliminated. A still further alternate embodiment is the elimination of either, but not both of the third and fourth stages. For example, placing a second linear stage such as the third stage immediately above the first stage, in an orthogonal arrangement followed by the rotational second stage, provides much of the flexibility of the four stages. These and other variations are to be included in the spirit of the present invention. In addition, the various stages can be stacked vertically in any order, and these variations are all included in the present invention.

As illustrated in FIG. 1, the specimen 20 to be observed is mounted on the stage 18, or i.e. on a plate 21 attached to stage 18, and a static source (energy) beam 36 is applied to form a focused spot 38 on the specimen 20. The beam 36 can be any type of energy beam as required for the particular imaging operation. For example, it can be an electron beam, ion beam or photon beam. The axis of rotation 24 of the rotational stage 14 is preferably aligned with the optical axis 40 of the focused beam system at the beginning of a scanning procedure. Other starting points are also included as alternate embodiments of this invention.

Figure 2:
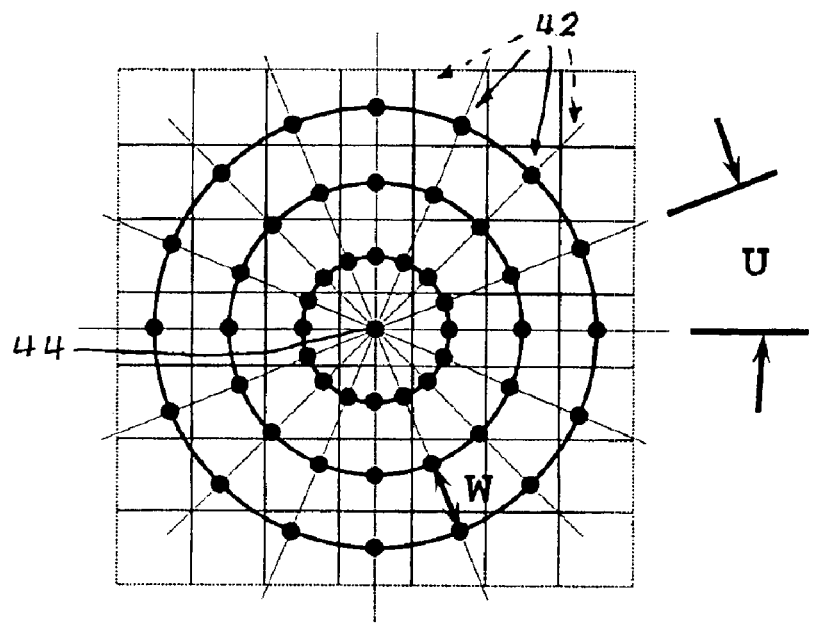
FIG. 2 is a plot illustrating a typical scanning and acquisition pattern using a concentric circular polar coordinates addressing method as applied by the embodiment of FIG. 1.

An area of interest on the specimen 20 is moved to the static source beam 36 spot 38 by moving the X positioning stage 18 and the Y positioning stage 16. The X and Y positioning stages 18 and 16 may be activated by wireless control or other means of remote activation, symbolically represented by controller 32 and arrow 34. The scanning motion of the mechanical stage 10 includes rotational motion provided by the rotational stage 14 such that the specimen 20 rotates in the rotational direction 26, and linear motion provided by the linear scanning stage 12, scanning in the direction 22. The rotational stage 14 may be rotated in the clockwise or counter clockwise direction. The source beam 36 remains stationary, directed along the axis 40. The scanning operations are performed by the stage 10 elements 12-18. As referred to above for one embodiment, the mechanical stage can be positioned initially so as to place the rotational axis 24 in alignment with the beam axis 40. Starting in this position, a movement of the linear stage 12 one unit along the axis 22 moves the axis of rotation 24 of the rotational stage one unit away from the axis 40 of the beam 36. As a result, the static source beam 36 can be activated to irradiate specimen areas along a circular path on the rotating specimen 36 as the rotational stage 14 is rotated. After the rotational stage 14 has rotated one revolution, the linear scanning stage 12 moves a pre-programmed distance, enabling the static source beam 36 to address areas on another concentric path as the stage 14 is rotated. As the linear scanning stage 12 moves further, the source beam 36 addresses a point further from the axis of rotation of the specimen stage 14. This linear movement of the linear scanning stage 12 is preferably stopped when the source beam 36 reaches the edge of an area of interest on the specimen 20. The linear movement may reverse its direction until the source beam 36 addresses the starting point again and vice versa. The above description details how image pixels corresponding to areas of interest on the specimen are addressed using concentric circular polar coordinates. This is further as depicted in FIG. 2. FIG. 2 illustrates a pattern of specimen areas shown as dots 42, that are accessed by simply stepping the linear first stage 12 an increment/step equal to "W" from the center 44, and the measurement of signal is acquired at time increments/steps "U" while the rotational stage 14 rotates at constant speed. When the stage 10 moves the specimen so as to position a desired area 42 in line with the beam 36, the beam is activated, and the measurement is acquired.

In the above described example of operation of the mechanical stage 10, the third and fourth stages 16 and 18 are used to initially position the beam 36 at a required central location of an area of interest on the specimen. Subsequent to this positioning, the stages 16 and 18 preferably remain in a fixed position relative to the rotational stage axis 24, serving no further purpose.

Figure 3:
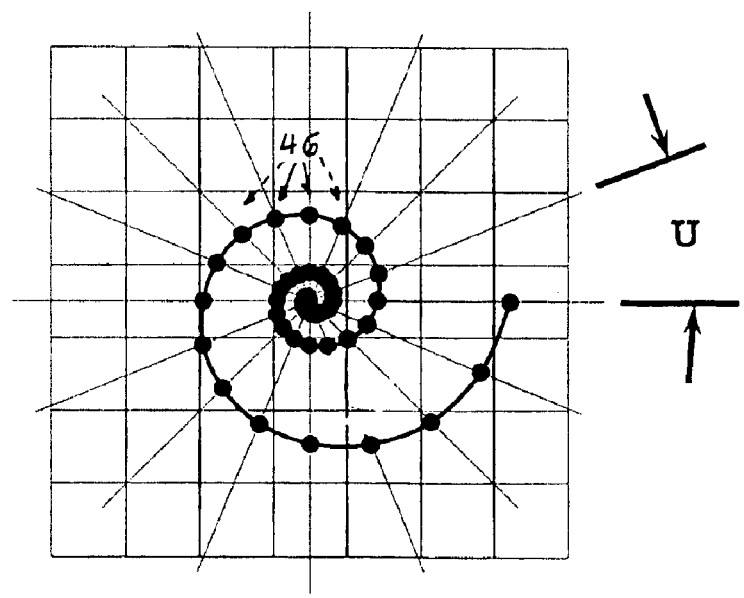
FIG. 3 is a plot illustrating a scanning and acquisition pattern using a spiral polar coordinates addressing method as applied by the embodiment of FIG. 1.

In another embodiment of operation of the mechanical stage 10, the linear scanning stage 12 moves simultaneously and concurrently with the rotational stage 14. The image pixels can then be addressed using spiral polar coordinates as depicted in FIG. 3. FIG. 3 illustrates areas on the specimen shown as dots 46, wherein similar to the process described in reference to FIG. 2, the mechanical stage is directed by a controller to bring the desired areas 46 in line with the beam 36. When an area 46 is in line with the beam, the beam source (not shown) is activated to apply the energy (beam), irradiating the area, resulting in the system acquiring the desired signal/measurement. The equipment for detecting and displaying such signals is well known to those skilled in the art, and need not be described herein in order for someone skilled in the art to reproduce the present invention.

Another embodiment of the mechanical stage 10 of the present invention includes only the linear stage 12 and rotational stage 14, omitting the X and Y stages 16 and 18. Operation in this embodiment requires manual alignment of a specimen orthogonal to the direction 22 of the linear stage 12. The specimen is mounted on the upper stage, for example on the rotational stage 14 if the rotational stage is above the linear stage. The initial position of the specimen is then adjusted either manually, or manually and in combination with the linear stage 12.

The apparatus of the present invention operated as described above, minimizes or eliminates linear stop and start motions, and totally avoids the settling down and "fly back" involved in the prior art line scanning systems which are responsible for the long image acquisition times of the prior art. The operation of the present invention illustrated in FIG. 3 and described above, eliminates all stop and start operations in image acquisition. The method described above employing concentric circles of acquisition as shown in FIG. 2, minimizes the magnitude of linear stop and start movements and avoids the prior art requirement of "fly back". In the method of FIG. 2, the source beam irradiates a full circular path after each unit movement of the linear scanning stage 12, and the complete circular images require the linear scanning stage 12 to travel a total distance of only one half the image diameter. The static, non-moving, focused beam of the present invention avoids the problems associated with moving a beam. Prior art systems that required scanning the beam, for example, have an undesirable characteristic known as beam aberration. The apparatus of the present invention has the additional advantage of making it practical to scan a larger area of the specimen compared to a scanning beam system. In other words, the apparatus of the present invention can scan a large area without sacrificing image quality. This is not possible with a beam scanning system. Prior art mechanically scanned stages have the disadvantage of being very slow.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of scanning a specimen in an image acquisition system comprising:

(a) placing a specimen on a mechanical stage for positioning and scanning said specimen for irradiation by an energy beam;

(b) first moving said specimen along a first axis by a first stage of said mechanical stage providing linear positioning and scanning movement;

(c) second moving said specimen by a second stage of said mechanical stage providing scanning rotational movement; and (d) impacting said specimen with a non-scanning energy beam, whereby the image is acquired during the scanning movements of the stages.

2. A method as recited in claim 1 further comprising directing movement of said mechanical stage by a controller.

3. A method as recited in claim 2 wherein said controller directs said scanning of said specimen by directing said first stage to sequentially position said specimen at each of a plurality of steps, and directs said second stage to sequentially rotate to a plurality of rotational positions for each said step.

4. A method as recited in claim 1 further comprising:
   (a) third moving said specimen by a third stage providing linear movement in an X direction; and
   (b) fourth moving said specimen by a fourth stage providing linear movement in a Y direction orthogonal to said X direction.

5. A method as recited in claim 4 wherein said third and fourth stages are for initial positioning of said specimen.

6. A method as recited in claim 1 further comprising third moving said specimen by a third stage providing linear movement orthogonal to said first axis.

7. A method as recited in claim 6 wherein said first stage is for scanning, and said third stage is for specimen positioning and is mounted on top of said second stage.

8. A method as recited in claim 7 wherein said second stage is mounted on top of said first stage.

9. A method as recited in claim 4 wherein said second stage is mounted on top of said first stage.

10. A method as recited in claim 1 further comprising programming a controller to direct movement of said first and second stages so as to cause said first stage to move simultaneously with said second stage.

11. A method as recited in claim 10 wherein said first and second stages are moved so as to address a location of interest on said specimen using spiral polar coordinates.

* * * * *